United States Patent
Kirkpatrick et al.

(10) Patent No.: US 6,720,247 B2
(45) Date of Patent: Apr. 13, 2004

(54) PRE-PATTERN SURFACE MODIFICATION FOR LOW-K DIELECTRICS USING A H2 PLASMA

(75) Inventors: Brian K. Kirkpatrick, Allen, TX (US); Michael Morrison, Tempe, AZ (US); Andrew J. McKerrow, Dallas, TX (US); Kenneth J. Newton, McKinney, TX (US); Dirk N. Anderson, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 00 days.

(21) Appl. No.: 10/001,327

(22) Filed: Oct. 25, 2001

(65) Prior Publication Data
US 2002/0111017 A1 Aug. 15, 2002

Related U.S. Application Data

(60) Provisional application No. 60/255,715, filed on Dec. 14, 2000.

(51) Int. Cl.$^7$ .................................................. H01J 21/4763
(52) U.S. Cl. .......................... 438/622; 438/618; 438/692
(58) Field of Search ............................. 438/618, 622, 438/623, 625, 632, 690, 691, 692, 698, 780, 781

(56) References Cited

U.S. PATENT DOCUMENTS

| | | | | |
|---|---|---|---|---|
| 5,849,640 A | * | 12/1998 | Hsia et al. | 438/734 |
| 6,110,648 A | * | 8/2000 | Jang | 430/312 |
| 6,153,519 A | * | 11/2000 | Jain et al. | 438/681 |
| 6,362,109 B1 | * | 3/2002 | Kim et al. | 438/706 |
| 6,472,335 B1 | * | 10/2002 | Tsai et al. | 438/780 |
| 6,475,707 B2 | * | 11/2002 | Yu | 430/325 |

* cited by examiner

*Primary Examiner*—Amir Zarabian
*Assistant Examiner*—Pamela Perkins
(74) *Attorney, Agent, or Firm*—Jacqueline J. Garner; W. James Brady, III; Frederick J. Telecky, Jr.

(57) ABSTRACT

A low-k dielectric layer (104) is treated with a dry $H_2$ plasma pretreatment to improve patterning. Resist poisoning occurs due to an interaction between low-k films (104), such as OSG, and DUV resist (130). The $H_2$ plasma pre-treatment is performed to either pretreat a low-k dielectric (104) before forming the pattern (130) or during a rework of the pattern (130).

11 Claims, 2 Drawing Sheets

PRE-PATTERN SURFACE MODIFICATION FOR LOW-K DIELECTRICS USING A H2 PLASMA

This application claims priority under 35 USC §119(e)(1) of provisional application No. 60/255,715 filed Dec. 14, 2000.

FIELD OF THE INVENTION

The invention is generally related to the field of forming interconnect layers in a semiconductor device and more specifically to patterning low-k dielectric films.

BACKGROUND OF THE INVENTION

As the density of semiconductor devices increases, the resistance-capacitance (RC) delay time in the back-end-of the-line (BEOL) increases and dominates the circuit performance. To reduce RC delay time at BEOL, the demands on interconnect layers for connecting the semiconductor devices to each other also increase. Therefore, there is a desire to switch from the traditional aluminum metal interconnects to copper interconnects and from traditional silicon-dioxide-based dielectrics to low-k dielectrics, such as organo-silicate glass (OSG). Semiconductor fabrication processes for working with the copper interconnects and newer low-k dielectrics are still needed.

As compared to the traditional subtractive plasma dry etching of aluminum, suitable copper etches for a semiconductor fabrication environment are not readily available. To overcome the copper etch problem, damascene processes have been developed. In a damascene process, the IMD (intra-metal dielectric) is formed first. The IMD is then patterned and etched to form trenches for the interconnect lines. If connection vias have not already been formed, a dual damascene process may be used. In a dual damascene process, an ILD (interlevel dielectric) is deposited before the IMD. An etch-stop layer, such as SiN, can be optionally used in between the IMD and the ILD. The via is formed in the ILD for connection to lower interconnect levels and the trench is formed in the IMD. A barrier layer and a copper seed layer are then deposited over the structure. The barrier layer is typically tantalum nitride or some other binary transition metal nitride. The copper layer is electrochemically deposited (ECD) using the seed layer over the entire structure. The copper is then chemically-mechanically polished (CMP'd) to remove the copper from over the IMD, leaving copper interconnect lines and vias. A metal etch is thereby avoided.

When low-k dielectrics such as OSG are used for the IMD and ILD, a problem known as resist poisoning occurs. Resist poisoning occurs during a patterning step such as via pattern or trench pattern. It is a result of the interaction between a DUV (deep ultra-violet) resist and low-k films. Resist poisoning causes poor resist sidewall profiles, resist scumming, and large CD variations. Furthermore, the required resist exposure dose to achieve the target CD becomes too high and varies with film aging. A process to reduce or eliminate resist poisoning in low-k dielectrics is therefore desired.

SUMMARY OF THE INVENTION

The invention is a surface treatment for low-k films that improves patterning. The low-k film is treated with a dry plasma process to eliminate or significantly reduce resist poisoning. A gas chemistry of $H_2$ with an inert gas such as Ar or $N_2$ is used. The $H_2$ plasma treatment can be performed at various stages in the semiconductor fabrication process with or without the presence of resist. For example, this treatment can be applied to as-deposited low k films before patterning (pre-treatment) or to stripping photo resist for lithograph rework.

An advantage of the invention is providing a treatment to reduce or eliminate resist poisoning of low-k dielectric films.

This and other advantages will be apparent to those of ordinary skill in the art having reference to the specification in conjunction with the drawings.

DETAILED DESCRIPTION OF THE EMBODIMENTS

The invention will now be described in conjunction with dual damascene copper interconnect process. It will be apparent to those of ordinary skill in the art that the benefits of the invention may be applied generally to patterning of low-k (K<3.0) and ultra-low-k (K<2.5) films.

Figure 1A:
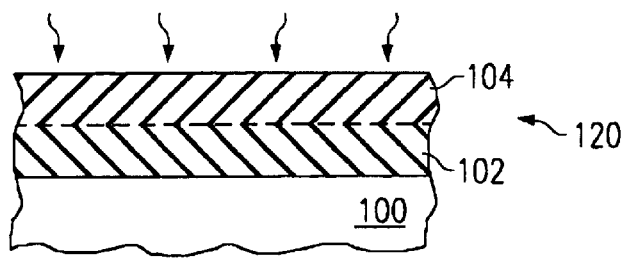
FIGS. 1A–1F are cross-sectional diagrams of a process for forming metal interconnects according to the embodiments of the invention.

In order to form the copper interconnects using a dual damascene process, the interlevel dielectric (ILD 102) and intrametal dielectric (IMD 104) in FIG. 1A are patterned and etched to form trenches in IMD 104 and vias in ILD 102. When low-k or ultra low-k materials are used for the ILD and IMD, an interaction between the resist and the low-k materials causes resist poisoning. The cause of resist poisoning is believed to be the interaction of between the DUV resist and nitrogen-containing reagents from the low-k films. Possible sources of nitrogen include: the low-k film, the dielectric cap, the optional IMD etch-stop layer (e.g., SiN), $N_2$ in the clean (ash) process, $N_2$ in the etch chemistry, and the photoresist itself.

In order to reduce or eliminate the resist poisoning, a pre-pattern treatment using a dry (plasma) process is performed. The dry process cleans the surface of the IMD by removing surface particles and etch polymers. A reducing-type plasma with a gas chemistry of $H_2$ with an inert gas such as argon or nitrogen is used. $H_2$/Ar is used in the preferred embodiment as $N_2$ adds an additional nitrogen source.

As an example, the following $H_2$/Ar plasma process may be used for the first dry step:

| | |
|---|---|
| Time: | 1–3 mm., preferably 2 min. |
| Pressure: | 500–1500 mT, preferably 700 mT |
| Power: | 600–1000 W, preferably 950 W |
| Flow: | 1000–3000 sccm $H_2$, preferably 3000 sccm |
| | 500–2000 sccm Ar, preferably 2000 sccm |
| Chuck Temp.: | 150–265° C., preferably 250° C. |

Embodiments of the invention will now be discussed with reference to FIGS. 1A–1F. A semiconductor body 100 is processed through formation of the ILD 102/IMD 104. Semiconductor body 100 typically comprises a silicon substrate having transistors and other elements formed therein. IMD 104 is the dielectric for a copper interconnect level. Copper interconnect level may be the first or any subsequent metal interconnect level of the semiconductor device 120.

An ILD 102 is formed over semiconductor body 100. IMD 104 is formed over ILD 102. A trench etch-stop layer (not shown) may optionally be placed between ILD 102 and IMD 104. ILD 102 and IMD 104 comprise low-k or ultra low-k dielectrics, such as organo-silicate glass (OSG). In the preferred embodiment, ILD 102 and IMD 104 comprise the same material. However, ILD 102 and IMD 104 may alternatively comprise different materials. A capping layer (not shown) may be formed over IMD 104 if desired. Typically, the capping layer comprises silicon nitride, Alternatively, silicon oxide, silicon oxynitride (SiON), or Si-rich nitride (SRN) or SiC capping layer, or no capping layer may be used.

Figure 1B:
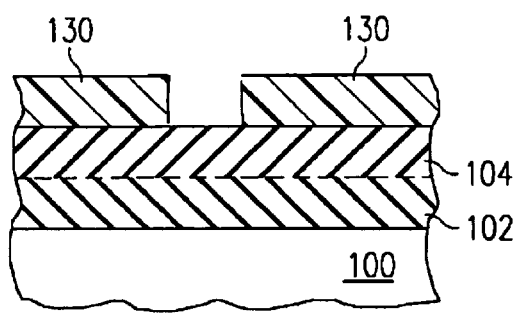

In a first embodiment of the invention, a pre-pattern dry treatment is performed prior to forming the via pattern 130. A plasma process is used with a gas chemistry comprising $H_2$ and an inert gas such as argon or nitrogen. Then, the via pattern 130 is formed as shown in FIG. 1B. The pre-pattern $H_2$ plasma treatment reduces resist poisoning at the via pattern level.

It is sometimes necessary to rework a resist pattern. Rework is a process of removing the photoresist and/or BARC material for re-patterning. Pattern re-work significantly worsens the resist poisoning problem if a non-optimized ash process is used for re-work. Accordingly, in a second embodiment of the invention, the $H_2$ plasma pre-treatment is used to rework via pattern 130. Using the $H_2$ plasma pre-treatment according to the invention as a pattern re-work reduces or eliminates resist poisoning associated with the via pattern.

Figure 1C:
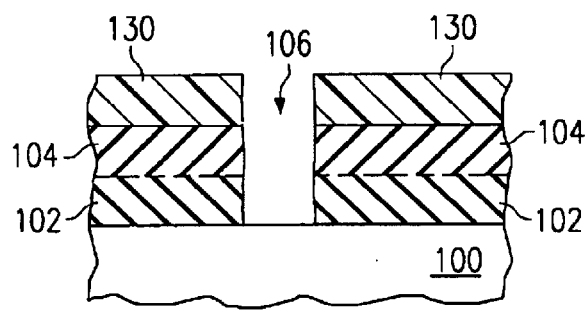

After any desired pattern re-work, the via 106 is then etched through IMD 104 and ILD 102, as shown in FIG. 1C. In order to protect the bottom of via 106 during the subsequent trench etch, via 106 may be partially or completely filled. For example, an organic barc (bottom anti-reflection coating) may be deposited over the structure and etched back such that BARC material remains only in the vias 106.

Figure 1D:
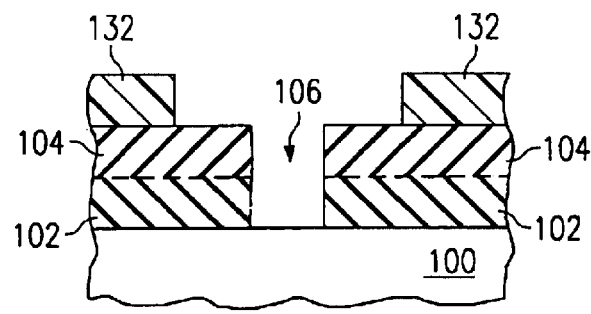

After a post via etch clean, a pre-trench pattern dry treatment is performed prior to forming the trench pattern 132, according to a third embodiment of the invention. A plasma process is used with a gas chemistry comprising $H_2$ and an inert gas such as argon or nitrogen. Then, the trench pattern 132 is formed over IMD 104, as shown in FIG. 1D. The pre-pattern $H_2$ plasma treatment reduces resist poisoning at the trench pattern level.

Figure 1E:
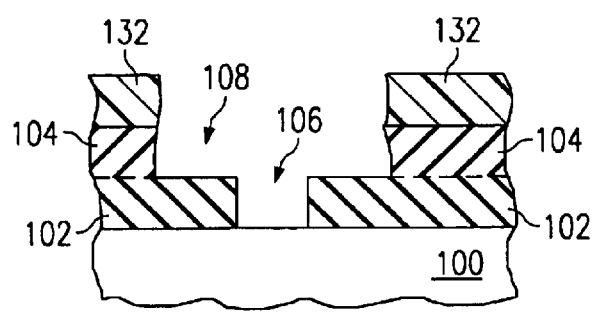

After any desired pattern rework, a trench 108 is etched in IMD 104, as shown in FIG. 1E. Trench pattern 132 is then removed.

Barrier layer 110 is deposited over IMD 104 including in trench 108 and via 106. Barrier layer 110 functions to prevent copper diffusion into the ILD and IMD layers. Suitable barrier materials such as Ta/TaN are known in the art. A seed copper layer is then deposited over barrier layer 110.

Electrochemical deposition (ECD) may then be used to deposit copper layer 124. Various copper ECD processes are known in the art. In one example, a 3-step process is used. After placing the wafer in the plating solution, a current of approximately 0.75 Amps is passed through the seed layer for a time on the order of 15 seconds. The current is then increased to around 3 Amps for approximately 60 seconds. Final plating occurs at a current of about 7.5 Amps with the duration determined by the final desired thickness. A quick spin-rinse dry (SRD) is performed in the plating cell above the plating solution. The wafer is then transferred to the SRD cell and a post-ECD SRD is used to clean the plating residue.

Figure 1F:
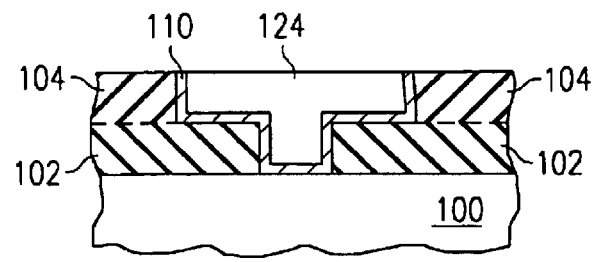

After copper ECD, the copper 124 and barrier 110 are chemically mechanically polished (CMP) to remove the material from above IMD 104. The resulting structure is shown in FIG. 1F. Next level ILD and IMD may be deposited and processing may then continue to form additional metal interconnect levels and package the device.

Figure 2A:
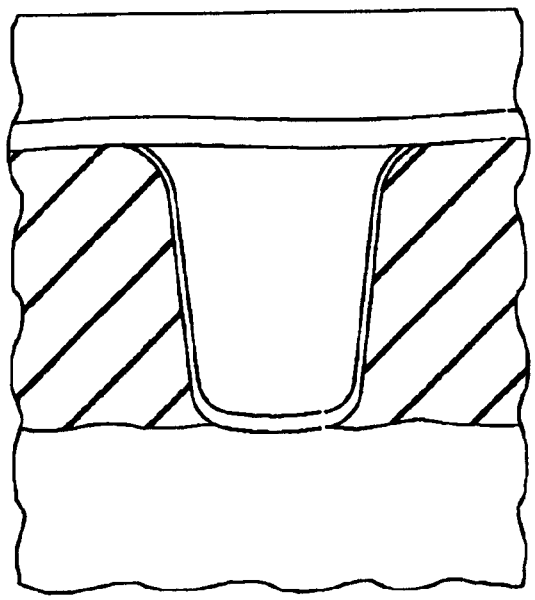
FIG. 2A is a cross-sectional SEM diagram of an etched via without pre-treatment according to the invention.
Figure 2B:
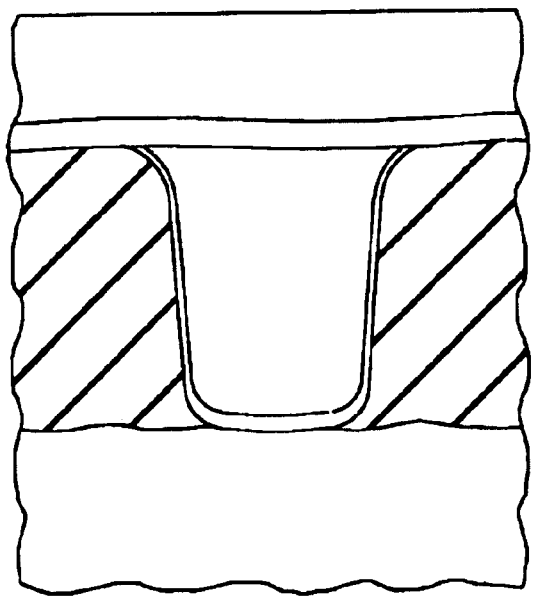
FIG. 2B is a cross-sectional SEM diagram of an etched via with pretreatment according to the invention.

As a result of the $H_2$ plasma pre-treatment according to the invention, the DUV pattern energy required to achieve the target CD (critical dimension) is reduced and the via sidewall angle is increased. FIG. 2A is a cross-sectional SEM showing an etched via without pre-treatment of the OSG dielectric. The exposure energy dose was 35 mJ/cm$^2$ and the via sidewall angle was 81–82°. FIG. 2B is a cross-sectional SEM showing an etched via with a $H_2/N_2$ plasma pretreatment according to the invention. The exposure energy was 30 mJ/cm$^2$ and the resulting via sidewall angle was 86°.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating an integrated circuit, comprising the steps of:

forming a low-k dielectric layer over a semiconductor body;

forming a resist pattern over said low-k dielectric layer, wherein said step of forming a resist pattern further comprises the step of performing a pre-pattern surface modification by treating said low-k dielectric layer with a reducing plasma comprising hydrogen in order to reduce or eliminate resist poisoning; and etching said low-k dielectric layer using said resist pattern.

2. The method of claim 1, wherein said reducing plasma comprises $H_2$ and $N_2$.

3. The method of claim 1, wherein said reducing plasma comprises $H_2$ and Ar.

4. The method of claim 1, wherein said low-k dielectric layer comprises organo-silicate glass.

5. A method of fabricating an integrated circuit having copper metal interconnects, comprising the steps of:

forming an interlevel dielectric (ILD) over a semiconductor body;

forming an intrametal dielectric (IMD) over the ILD;

forming a via resist pattern over said IMD wherein said step of forming a via resist pattern further comprises the step of performing a pre-pattern surface modification by plasma treating said IMD using $H_2$ and an inert gas in order to reduce or eliminate resist poisoning;

etching a via in said IMD and ILD using said via resist pattern;

removing said via resist pattern;

at least partially filling said via with a material;

farming a trench resist pattern aver said IMD;

etching a trench in said IMD using said trench resist pattern;

removing said trench resist pattern and said material in said via; and forming a copper interconnect in said via and said trench.

6. The method of claim 5, wherein said inert gas comprises Ar.

7. The method of claim 5, wherein said inert gas comprises $N_2$.

8. The method of claim 5, wherein said plasma treating step is repeated after the step of forming the via resist pattern as part of a pattern re-work step.

9. The method of claim 5, further comprising the step of treating the IMD with a hydrogen plasma prior to forming the trench resist pattern.

10. The method of claim 9, wherein said hydrogen plasma uses a $H_2$ and Ar gas chemistry.

11. A method of fabricating an integrated circuit having copper metal interconnects, comprising the steps of:

forming an interlevel dielectric (ILD) over a semiconductor body;

forming an intrametal dielectric (IMD) over the ILD;

performing a first pre-pattern surface modification by treating said IMD with a reducing plasma comprising hydrogen;

then, forming a vie resist pattern over said IMD;

etching a via in said IMD using said via resist pattern;

removing said via resist pattern;

then, performing a second pre-pattern surface modification by treating said IMD with a reducing plasma comprising hydrogen after removing said via resist pattern;

then, forming a trench resist pattern over said IMD;

etching a trench in said IMD using said trench resist pattern;

removing said trench resist pattern; and forming a copper interconnect in said via and said trench.

* * * * *